(12) United States Patent
Shi et al.

(10) Patent No.: US 9,608,800 B2
(45) Date of Patent: Mar. 28, 2017

(54) FREQUENCY AIDED CLOCK RECOVERY BASED ON LOW SPEED INFORMATION EXCHANGE MECHANISM

(71) Applicant: QUALCOMM INCORPORATED, San Diego, CA (US)

(72) Inventors: Qing Shi, Shanghai (CN); Yahuan Liu, Shanghai (CN); Robert Yongli Wen, San Diego, CA (US); James Qian Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/032,042

(22) PCT Filed: Dec. 3, 2013

(86) PCT No.: PCT/CN2013/088381
§ 371 (c)(1),
(2) Date: Apr. 25, 2016

(87) PCT Pub. No.: WO2015/081482
PCT Pub. Date: Jun. 11, 2015

(65) Prior Publication Data
US 2016/0359612 A1    Dec. 8, 2016

(51) Int. Cl.
*H04L 7/04* (2006.01)
*H04L 7/02* (2006.01)
(Continued)

(52) U.S. Cl.
CPC .............. *H04L 7/02* (2013.01); *H03L 7/085* (2013.01); *H03L 7/0807* (2013.01);
(Continued)

(58) Field of Classification Search
CPC ....... H04L 27/01; H04L 1/0002; H04L 69/24; H04L 7/0029; H04L 5/1446;
(Continued)

(56) References Cited

U.S. PATENT DOCUMENTS 6,577,689 B1  6/2003 Smith et al.
7,787,528 B2  8/2010 Kawamoto et al.
(Continued)

FOREIGN PATENT DOCUMENTS

EP           2073565 A2      6/2009
WO    WO-2008003196 A1      1/2008
WO    WO-2011013485 A1      2/2011

OTHER PUBLICATIONS

International Search Report and Written Opinion—PCT/CN2013/088381—ISA/EPO—Sep. 26, 2014.

*Primary Examiner* — Rahel Guarino
(74) *Attorney, Agent, or Firm* — Paradice and Li LLP (57) ABSTRACT

A method and apparatus of clock recovery is disclosed. A communications device matches the frequency of a local clock signal with the frequency of a transmit clock signal of a transmitting device based on a first set of signals received from the transmitting device during a low-speed information exchange. The low-speed information exchange may correspond to an autonegotiation operation, wherein each of the transmitting device and the communications device declares its communication capabilities to the other device. The communications device then determines a frequency offset to be applied to the local clock signal during a high-speed data communication with the transmitting device. During the high-speed communication, the communications device may apply the frequency offset to the local clock signal and match the phase of the receive clock signal with the phase (Continued)

of the transmit clock signal based on a second set of signals received from the transmitting device.

30 Claims, 7 Drawing Sheets (51) Int. Cl.
*H03L 7/08* (2006.01)
*H03L 7/081* (2006.01)
*H03L 7/183* (2006.01)
*H03L 7/085* (2006.01)
*H04L 7/00* (2006.01)

(52) U.S. Cl.
CPC ............ *H03L 7/0814* (2013.01); *H03L 7/183* (2013.01); *H04L 7/0087* (2013.01)

(58) Field of Classification Search
CPC ............... H04L 12/40097; H04L 12/46; H04L 49/3054; H04L 49/352; H04L 69/18; H04L 12/40032; H03L 7/08; H03K 5/26
USPC ........ 375/376, 375, 225, 362, 294; 710/315, 710/305, 60
See application file for complete search history.

(56) References Cited

U.S. PATENT DOCUMENTS

| | | |
|---|---|---|
| 2010/0150288 A1 | 6/2010 | Zhu et al. |
| 2011/0188621 A1* | 8/2011 | Asaduzzaman ....... H03L 7/0814 375/374 |
| 2012/0200324 A1 | 8/2012 | Wang |
| 2012/0250728 A1 | 10/2012 | Pischl et al. |

* cited by examiner

FREQUENCY AIDED CLOCK RECOVERY BASED ON LOW SPEED INFORMATION EXCHANGE MECHANISM

TECHNICAL FIELD

The present embodiments relate generally to clock recovery in asynchronous communications systems, and specifically to clock recovery in high-speed Ethernet systems.

BACKGROUND OF RELATED ART

Figure 1:
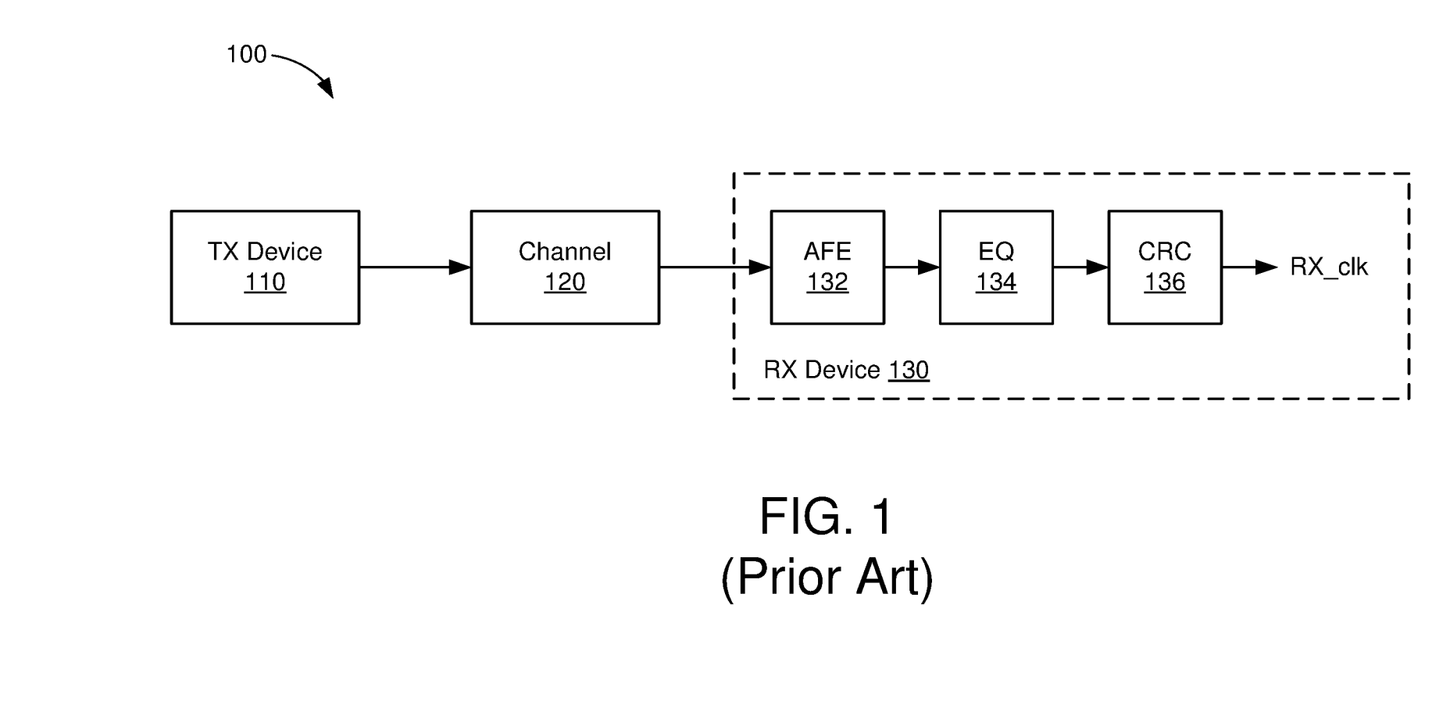
FIG. 1 shows an exemplary communications system with asynchronous clock recovery.

Timing recovery is an important function of most Ethernet systems. Because a transmitting (TX) device typically transmits data to a receiving (RX) device in an asynchronous manner (i.e., without an accompanying clock signal), the RX device may generate an internal clock signal that is both frequency-aligned and phase-aligned with the received data signal. FIG. 1 shows an exemplary communications system 100 with asynchronous clock recovery. A TX device 110 transmits a signal onto a communications channel 120, and a RX device 130 receives the signal from the channel 120. The RX device 130 includes an analog front end (AFE) 132, an equalizer (EQ) 134, and a clock recovery circuit (CRC) 136. The AFE 132 receives an analog data signal over the communications channel 120, and the equalizer 134 mitigates and/or eliminates intersymbol interference (ISI) in the analog data signal caused by the channel 120. The clock recovery circuit 136 may recover a clock signal (RX_clk) from the received data signal.

More specifically, the clock recovery circuit 136 may use phase and frequency information of the received data signal to align the phase and frequency of a locally-generated clock signal with the phase and frequency of the clock signal used by the TX device 110 (e.g., a transmit clock signal). For example, the clock recovery circuit 136 may adjust the frequency of its local receive clock signal to match the frequency of the transmit clock signal, for example, to correct for drift between the clock generators of devices 110. The clock recovery circuit 136 may also adjust the phase of the local receive clock signal to match the phase of the transmit clock signal, for example, so that an analog-to-digital converter (not shown for simplicity) within the Rx device 130 may sample each data symbol at its peak (e.g., to further reduce the effects of ISI).

Extracting phase and frequency information from a high-speed data signal may pose a number of challenges. For one example, higher-frequency data rates correlate with shorter symbol (peak) durations, and thus provide a smaller window within which the RX device 130 may accurately sample a received data signal (e.g., as compared with lower-frequency data rates). For another example, ISI is more pronounced at higher frequencies than at lower frequencies. Accordingly, if the frequency offset between the local receive clock signal and the transmit clock signal is above a limit value, then the equalizer 134 of the RX device 130 may be unable to properly mitigate the effects of ISI in the received data signal. As a result, the clock recovery circuit 136 typically scans through a series of fixed clock frequencies to ensure proper operation of the equalizer 134. However, scanning through the entire range of possible frequencies for a given communication protocol (e.g., ±200 ppm in 10 GBASE-KR Ethernet systems and ±600 ppm in PCIe systems) may consume a substantial amount of time and resources.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A device and method of operation are disclosed that may aid in clock recovery operations for high-speed Ethernet systems, for example, by leveraging an autonegotiation mechanism of the Ethernet standard to perform at least a portion of a clock recovery operation using relatively low-speed information exchanges and then performing the remaining portions of the clock recovery operation during subsequent, relatively high-speed data transmissions (e.g., rather than performing all of the clock recovery operation during the relatively high-speed data transmissions). In accordance with some embodiments, a communications device, acting as a receiving device, generates a first local receive clock signal to sample data received from a transmitting device. The transmitting device uses a first transmit clock signal to transmit a first set of signals (e.g., autonegotiation signals) to the receiving device during the relatively low-speed information exchange. The first transmit clock signal and the first receive clock signal are set, by their respective devices, at a relatively low frequency that may be predetermined or negotiated during the relatively low-speed information exchange. The receiving device receives the first set of signals from the transmitting device, determines a first frequency offset value that denotes of a difference in the relatively low frequencies of the first local receive clock signal and the first transmit clock signal, and then matches the frequency of the first local receive clock signal with the frequency of the first transmit clock signal. The first set of signals may also be used to negotiate relatively high frequency clock speeds and/or data rates for subsequent, relatively high-speed data transmissions between the devices. Then, during the relatively high-speed data transmissions, the transmitting device may use a second transmit clock signal to transmit data to the receiving device, and the receiving device may generate a second local receive clock signal to sample the data received from the transmitting device, wherein the frequency of the second transmit clock signal and the second local receive clock signal are greater than the first transmit clock signal and the first local receive clock signal.

The receiving device may use the first frequency offset value to determine a second frequency offset value that, in turn, may be used to match the frequency of the second local receive clock signal with the frequency of the second transmit clock signal (e.g., without using clock recovery techniques). For some embodiments, the receiving device may determine a factor that denotes the relative clock speeds associated with the relatively low-speed information exchange and the relatively high-speed data transmission, and then use the factor to derive the second frequency offset value from the first frequency offset value. For at least one embodiment, the factor may be determined by dividing the frequency of the second (e.g., the relatively high frequency) local receive clock signal by the frequency of the first (e.g., the relatively low frequency) local receive clock signal.

More specifically, during the subsequent relatively high-speed data transmissions, the transmitting device sets the frequency of the second transmit clock signal to the agreed upon relatively high frequency, and the receiving device sets the frequency of the second local receive clock signal to the agreed upon relatively high frequency. The receiving device may use the second frequency offset value to match the frequency of the second local receive clock signal to the frequency of the second transmit clock signal (e.g., without using clock recovery techniques). Then, the receiving device may match the phase of the second local clock signal with the phase of the second transmit clock signal based on a second set of signals (e.g., data) received from the transmitting device during the high-speed data communication.

In this manner, during the relatively high-speed data communication, the receiving device may use the second frequency offset value to align the frequency of the second local receive clock signal with the frequency of the second transmit clock signal, and may then use clock recovery techniques to align the phase of the second local receive clock signal with the phase of the second transmit clock signal. In other words, because the receiving device may use the second frequency offset value to align the frequency of the second local receive clock signal with the frequency of the second transmit clock signal, clock recovery techniques may not be necessary for frequency alignment during the relatively high-speed data communication. Accordingly, by using clock recovery techniques to match the phase of the receive clock signal to that of the transmit clock signal during the relatively high-speed data communications, the receiving device may complete high-speed clock recovery operations more quickly than conventional devices that use clock recovery techniques for both phase and frequency matching operations during relatively high-speed data transmissions.

For some embodiments, the relatively low-speed information exchange may be an autonegotiation operation during which the transmitting device and the receiving device declare their communications capabilities to each other. For example, the first set of signals may include a plurality of link pulses. The receiving device may match the frequency of the first local receive clock signal with the frequency of the first transmit clock signal by determining a first phase offset between the first local receive clock signal and the plurality of link pulses, and may then adjust the frequency of the first local receive clock signal based on the first phase offset. For some embodiments, the transmitting device may communicate with the receiving device using 10 GBASE-KR Ethernet protocols.

For some embodiments, the relatively low-speed information exchange may be an autonegotiation operation during which the transmitting device and the receiving device declare their communications capabilities to each other. For example, the first set of signals may include a plurality of link pulses. The receiving device may match the frequency of the first local receive clock signal with the frequency of the first transmit clock signal by determining a first phase offset between the first local receive clock signal and the plurality of link pulses, and may then adjust the frequency of the first local receive clock signal based on the first phase offset. For some embodiments, the transmitting device may communicate with the receiving device using 10 GBASE-KR Ethernet protocols.

Further, for some embodiments, the receiving device may include an equalizer to mitigate intersymbol interference (ISI) in the second set of signals received from the transmitting device (i.e., during the relatively high-speed data communication). The effects of ISI may be less pronounced in the first set of signals received from the transmitting device (received during the relatively low-speed information exchange) than in the second set of signals received from the transmitting device (received during the relatively high-speed data transmission).

BRIEF DESCRIPTION OF THE DRAWINGS

The present embodiments are illustrated by way of example and are not intended to be limited by the figures of the accompanying drawings, where like reference numerals refer to corresponding parts throughout the drawing figures.

DETAILED DESCRIPTION

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

As used herein, the term "relatively low speed" may be associated with a first range of clock frequencies used to transmit information during a relatively low-speed information exchange (e.g., an autonegotiation operation), and the term "relatively high speed" may be associated with a second range of clock frequencies used to transmit data during a relatively high-speed data transmission, wherein the second range of clock frequencies includes frequencies greater than those included in the first range of clock frequencies. For example, an exemplary embodiment described herein may use an illustrative relatively low frequency of 312.5 Mbps to perform the relatively low speed information exchanges, and may use an illustrative relatively high frequency of 10.3125 Gbps to perform the relatively high speed data transmissions. Thus, it is to be understood that the frequency values of 312.5 Mbps and 10.3125 Gbps are merely illustrative frequencies that fall within the first range and the second range, respectively.

In addition, as used herein, the term "first local receive clock signal" refers to clock signals generated by the receiving device during the relatively low-speed information exchange, the term "first transmit clock signal" refers to clock signals generated by the transmitting device during the relatively low-speed information exchange, the term "second local receive clock signal" refers to clock signals generated by the receiving device during the relatively high-speed data transmissions, and the term "second transmit clock signal" refers to clock signals generated by the transmitting device during the relatively high-speed data transmissions. Therefore, in accordance with the present embodiments, the term "local receive clock signal" may refer to both the first local receive clock signal and the second local receive clock signal, and the term "transmit clock signal" may refer to both the first transmit clock signal and the second transmit clock signal.

Figure 2A:
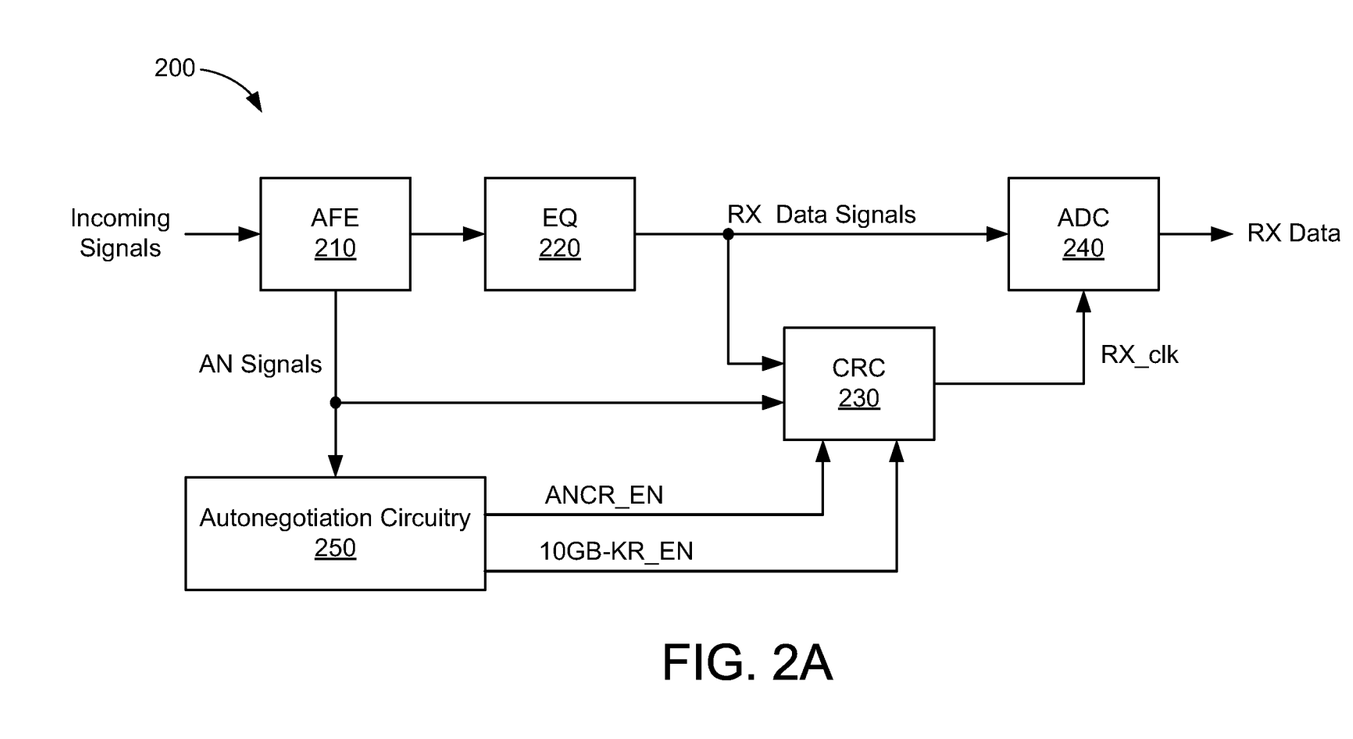
FIG. 2A shows a block diagram of a communications device in accordance with some embodiments.

FIG. 2A shows a block diagram of a communications device 200 in accordance with some embodiments. The device 200 includes an analog front end (AFE) 210, an equalizer (EQ) 220, a clock recovery circuit (CRC) 230, an analog-to-digital converter (ADC) 240, and autonegotiation circuitry 250. The AFE 210 receives analog signals, via a communications channel, from a transmitting (TX) device (not shown for simplicity). The equalizer 220 mitigates (e.g., reduces and/or eliminates) intersymbol interference (ISI) in the received signals. The CRC 230 may extract phase and frequency information from the received signals, and may adjust a phase and frequency of a local receive clock signal (RX_clk) based on the extracted phase and frequency information. The ADC 240 may recover digital data by sampling the received signals using the local receive clock signal, RX_clk. For some embodiments, the CRC 230 may be used during a relatively low-speed information exchange between the communications device 200 and an associated TX device to align the frequency of a first (e.g., relatively low-frequency) local receive clock signal with the frequency of a first (e.g., relatively low-frequency) transmit clock signal, and may be used during a subsequent relatively high-speed data transmission between the communications device 200 and the TX device to align the phase of a second (e.g., relatively high-frequency) local receive clock signal with the phase of a second (e.g., relatively high-frequency) transmit clock signal.

For example, the 10 GBASE-KR Ethernet standard defines an autonegotiation operation during which communications devices may negotiate communication parameters (e.g., communication speed, duplex mode, flow control, etc.) upon detecting each other on a network. Specifically, each device may declare its communication capabilities to the other device through the transmission of a series of link pulses, and the best mode of operation (e.g., the highest data rate) that is supported by both devices may then be chosen. Since neither device knows the communication capabilities of the other device prior to the autonegotiation operation, the information exchange typically occurs at relatively low speeds (e.g., compared with relatively high speeds for subsequent data transmissions between the devices). For example, for some embodiments, the information exchange associated with the autonegotiation operation may be performed at an exemplary relatively low speed of 312.5 Mbps, while the subsequent data transmissions may be performed at an exemplary relatively high speed of 10.3125 Gbps (although other clock frequencies may be used for the relatively low-speed information exchange and/or for the relatively high-speed data transmissions).

The autonegotiation circuitry 250 may interpret the autonegotiation (AN) signals received from the TX device, and may then configure the device 200 for subsequent high-speed data communications with the TX device. For example, the link pulses typically include a sequence of clock pulses and data pulses. The data pulses may be used to specify the operational parameters of the transmitting device, and the clock pulses may be used for timing and recovery of the data pulses. Because autonegotiation signals are transmitted at relatively low speeds (e.g., 312.5 Mbps), and because timing information (i.e., the clock pulses) is explicitly transmitted as part of the autonegotiation signals, conventional communications devices typically do not perform clock recovery on the received autonegotiation signals (e.g., because some clock information is already provided to the RX device).

In contrast to such conventional communications devices, communications device 200 may route the received autonegotiation signals to the CRC 230, which in turn may use the autonegotiation signals to determine a first frequency offset value between the first local receive clock signal and the first transmit clock signal. More specifically, the CRC 230 may be configured to perform clock recovery operations on the autonegotiation signals in response to an autonegotiation clock recovery enable (ANCR_enable) signal. The ANCR_EN signal may be generated by the autonegotiation circuitry 250 in response to detecting the autonegotiation signals received from the transmitting device. For some embodiments, the AFE 210 may output the autonegotiation signals directly to the CRC 230, thereby bypassing the equalizer 220 (e.g., as depicted in FIG. 2A). For example, because high-speed data signals are more sensitive to ISI than low-speed data signals, and because signal attenuation along the communications channel is greater for high-speed data signals than for low-speed data signals, high-speed data signals are typically passed through the equalizer 220 prior to performing clock recovery in conventional clock recovery systems. However, because autonegotiation signals are communicated at relatively low speeds and experience relatively low attenuation (e.g., as compared with the relatively high speeds of the subsequent data transmissions), the CRC 230 may accurately adjust the frequency of the first local receive clock signal based on the autonegotiation signals without ISI mitigation.

For some embodiments, the CRC 230 may adjust the frequency of the first local receive clock signal, based on the autonegotiation signals, using any suitable clock recovery technique. For example, the CRC 230 may include a clock generator (e.g., a phase-locked loop (PLL) and/or frequency synthesizer circuitry) to generate a first local receive clock signal that is both phase- and frequency-locked with the autonegotiation signals (e.g., as described in more detail below with respect to FIG. 5). Because autonegotiation signals are received at relatively low speeds, the CRC 230 may quickly match the frequency of the first local receive clock signal to the frequency of the first transmit clock signal without having to scan the entire available frequency range.

For the subsequent, relatively high-speed data transmissions, the CRC 230 may be configured to perform clock recovery operations on the relatively high-speed data transmission in response to an enable signal (10 GB-KR_enable), which may be generated by the autonegotiation circuitry 250. For some embodiments, the CRC 230 may determine a second frequency offset value to be applied to the second local receive clock signal during subsequent high-speed data communications based on the frequency matching information derived during the relatively low-speed information exchange (e.g., during the autonegotiation operation). For example, by adjusting the frequency of the first local receive clock signal based on the autonegotiation signals, the CRC 230 may determine the first (e.g., low-speed) frequency offset value between the first local receive clock and the first transmit clock of the TX device. Because both relatively low-speed and relatively high-speed clock signals are typically generated from the same crystal oscillator, the CRC 230 may calculate a second frequency offset value associated with the relatively high-speed clock signals as a scalar multiple (or fraction) of the first frequency offset value associated with the relatively low-speed clock signals. For example, the frequency offset value may be calculated based on the following equation:

$$Crystal\ frequency offset = \frac{Rx\_312.5M - Tx\_312.5M}{312.5*10^6}$$
$$= \frac{Rx\_10.3125G - Tx\_10.3125G}{10.3125*10^9}$$

where [Rx_312.5M–Tx_312.5M] represents the frequency offset for a 312.5 MHz clock signal, and where [Rx_10.3125G–Tx_10.3125G] represents the frequency offset for a 10.3125 GHz clock signal. Furthermore, the above equation can be rewritten:

$$Rx\_10.3125G - Tx\_10.3125G = (Rx\_312.5M - Tx\_312.5M) \times 33$$

Accordingly, the second frequency offset value (e.g., associated with the 10.3125 GHz clock signal) may be determined by multiplying the first frequency offset value (e.g., associated with the 312.5 MHz clock signal) by a factor of 33. In more general terms, the frequency offset value associated with a relatively high-speed clock signal may be determined by multiplying the frequency offset value associated with a relatively low-speed clock signal by a factor equal to the frequency of the relatively high-speed clock signal divided by the frequency of the relatively low-speed clock signal.

Figure 2B:
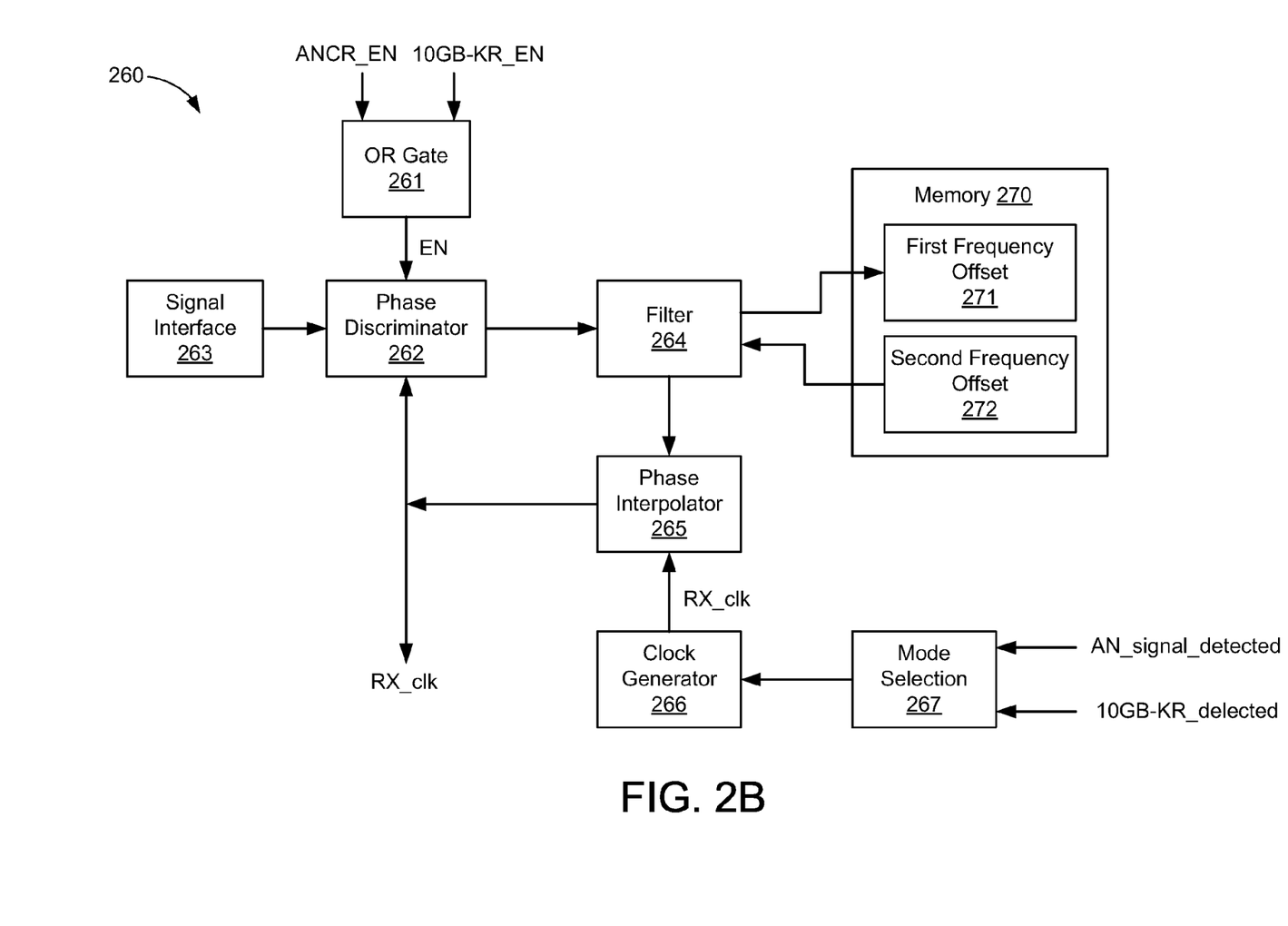
FIG. 2B shows a block diagram of the clock recovery circuit of FIG. 2A in accordance with some embodiments.
Figure 2C:
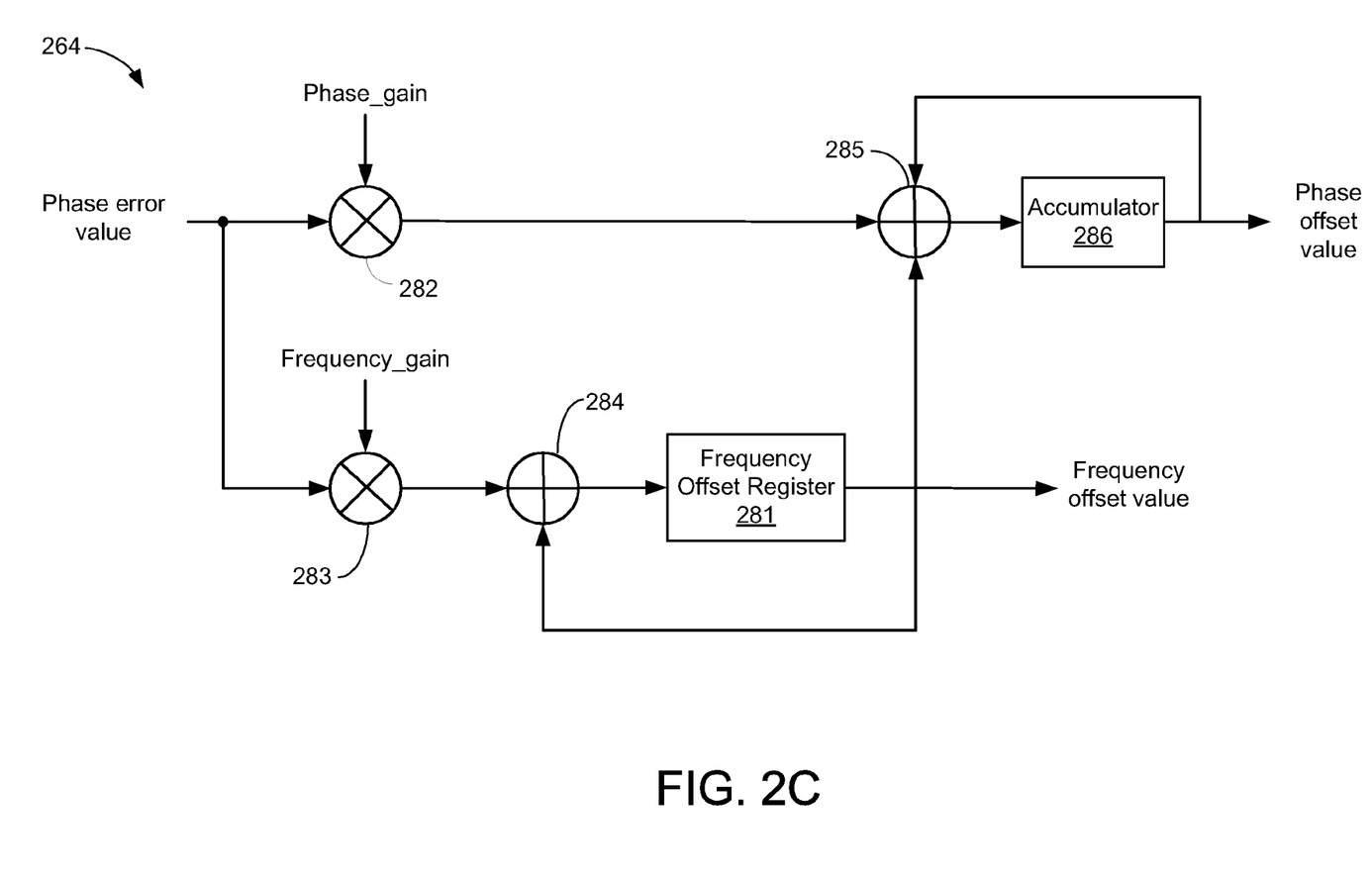
FIG. 2C shows a block diagram of the filter of FIG. 2B in accordance with some embodiments.

FIG. 2B is a block diagram of a CRC 260 that is one embodiment of the CRC 230 of FIG. 2A. The CRC 260 is shown to include an OR gate 261, a phase discriminator 262, a signal interface 263, a filter 264, a phase interpolator 265, a clock generator 266, a mode selection circuit 267, and a memory 270 to store the first frequency offset value 271 and the second frequency offset value 272. FIG. 2C is a block diagram of one embodiment of filter 264. The filter 264 includes a frequency offset register 281, mixers 282-283, summing nodes 284-285, and an accumulator 286 connected to one another as depicted in FIG. 2C. Because the configuration and operation of filter 264 is well-known, a detailed description of filter 264 is not provided herein.

The OR gate 261 receives the enable signals ANCR_EN and 10 GB-KR_EN (e.g., from the autonegotiation circuitry 250 of FIG. 2A), and in response thereto generates an enable (EN) signal for the phase discriminator 262. If either of the enable signals ANCR_EN or 10 GB-KR_EN is asserted (e.g., to logic high), then OR gate 261 asserts the EN signal (e.g., to logic high). For some embodiments, the enable signals ANCR_EN and 10 GB-KR_EN may be asserted when the clock generator 266 is stable. When the EN signal is asserted, the phase discriminator 262 may discriminate (e.g., compare) the phases of AN signals received from the transmitting device via the signal interface 263 with the phases of the RX_clk signal provided by clock generator 266.

The mode selection circuit 267 includes inputs to receive two control signals, AN_signal_detected and 10 GB-KR_selected. For some embodiments, the first control signal AN_signal_detected may a time-delayed version of the enable signal ANCR_EN, and the second control signal 10 GB-KR_selected may a time delayed version of the enable signal 10 GB-KR_EN.

During the relatively low-speed information exchanges, the enable signal ANCR_EN is asserted, which causes assertion of the control signal AN_signal_detected. In response thereto, the clock generator 266 generates the first local receive clock signal (e.g., the relatively low-frequency RX_clk signal). The clock signal RX_clk is provided to phase discriminator 262 via the phase interpolator 265. The phase discriminator 262 discriminates (e.g., compares) the relative phases of RX_clk and the received AN signals to generate a first phase offset value. The filter 264 generates the first frequency offset value in response to the first phase offset value, and stores the first frequency offset value 271 in memory 270. The second frequency offset value 272 may be calculated in response to the first frequency offset value 271 (as described above), and stored in memory 270 as the second frequency offset value 272.

During the relatively high-speed information exchanges, the enable signal 10 GB-KR_EN is asserted, which causes assertion of the control signal 10 GB-KR_detected. In response thereto, the clock generator 266 generates the second local receive clock signal (e.g., the relatively high-frequency RX_clk signal). The clock signal RX_clk is provided to phase discriminator 262 via the phase interpolator 265. The phase interpolator 265 receives the second frequency offset value, and in response thereto may adjust the second local receive clock signal until the second local receive clock signal is frequency aligned with the second transmit clock signal. Thereafter, the phase discriminator 262 may compare phases of the second local receive clock signal with phases of the received data (e.g., denotes the phases of the second transmit clock), and then adjust the phase of the second local receive clock signal until it is phase-aligned with the second transmit clock signal.

Figure 3:
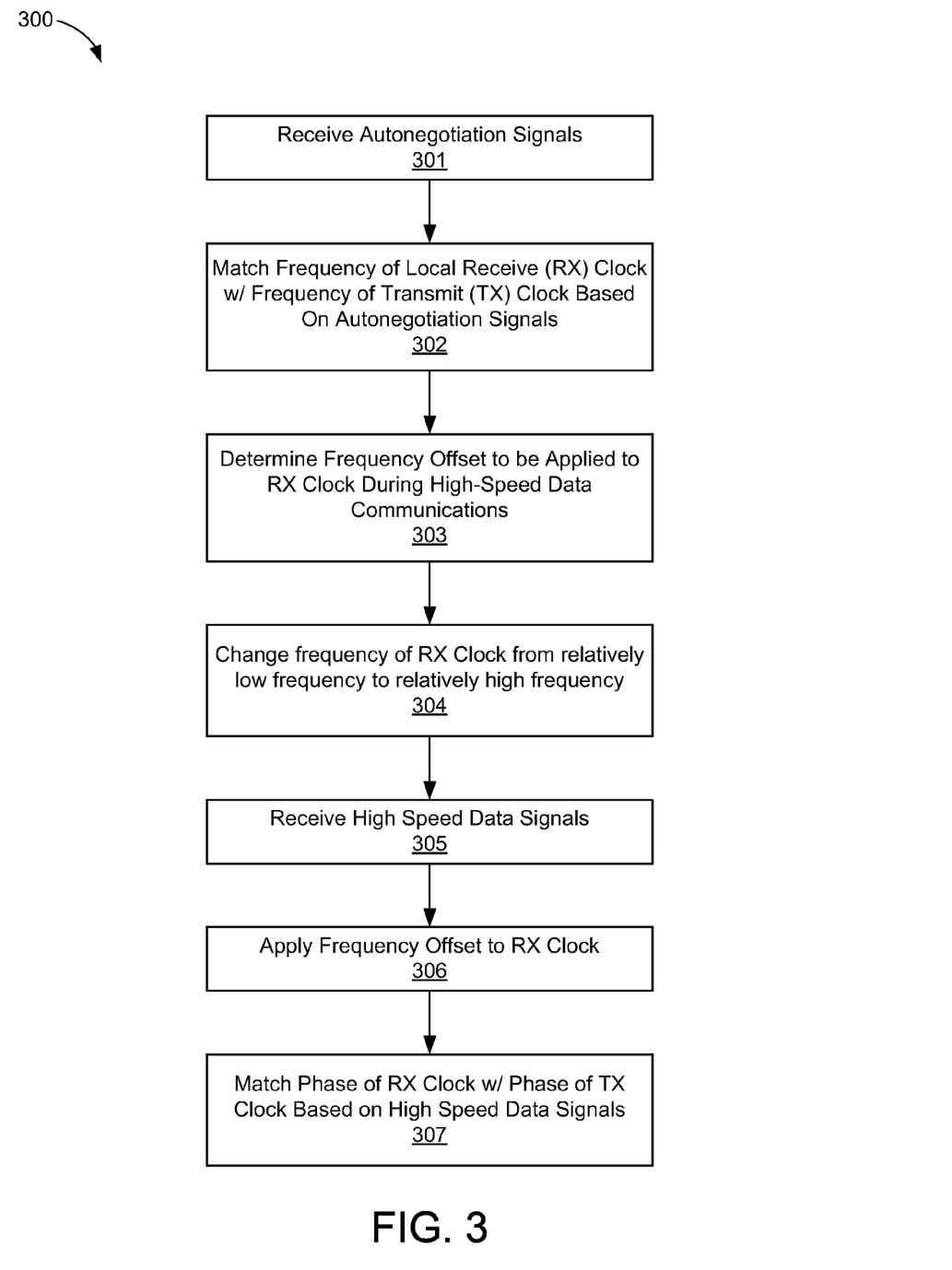
FIG. 3 is an illustrative flow chart depicting an exemplary clock recovery operation in accordance with some embodiments.

FIG. 3 is an illustrative flow chart 300 depicting an exemplary clock recovery operation in accordance with some embodiments. With reference, for example, to FIG. 2A, the communications device 200 receives a sequence of autonegotiation signals from a TX device (301). As described above, the autonegotiation signals may specify communications parameters (e.g., communication speed, duplex mode, flow control, etc.) that the TX device is able to support. These autonegotiation signals are communicated prior to establishing a high-speed data link with the TX device, and therefore may be transmitted at relatively low data speeds (e.g., as compared to the relatively high data speeds of the subsequently established high-speed data link). For an exemplary embodiment, the autonegotiation signals may be exchanged at a relatively low speed of 312.5 Mbps, and the subsequently established high-speed data link may be associated with a relatively high speed of 10.3125 Gbps (although other data speeds may be used for the autonegotiation operation and/or for the subsequently established high-speed data link).

The communications device 200 then matches the frequency of the first local receive clock signal with the frequency of the first transmit clock signal (used by the TX device) based on the received autonegotiation signals (302). For example, the CRC 230 may adjust the frequency of the first local receive clock signal, based on the autonegotation signals, using well-known clock recovery techniques. Because the autonegotiation signals are received at relatively low speeds, the CRC 230 may quickly match the frequency of the first local receive clock signal to the frequency of the first transmit clock signal without having to scan the entire available frequency range.

Upon matching the frequency of the first local receive clock signal to the frequency of the first transmit clock signal, the CRC 230 may determine a second frequency offset value to be applied to the second local receive clock signal during subsequent high-speed data communications (303). For example, the CRC 230 may first determine the first (e.g., low-speed) frequency offset value between the first local receive clock signal and the first transmit clock signal based on the low-speed information exchange (i.e., the autonegotiation signals). The CRC 230 may then calculate the second (e.g., high-speed) frequency offset value as a scalar multiple (or fraction) of the first frequency offset value, for example, using a factor that denotes the relative data rates of the relatively high-speed data communication and the relatively low-speed information exchange. It is noted that the relatively low-speed information exchange typically occurs at a predetermined data rate, while the data rate of the relatively high-speed data communication may be determined during the autonegotiation operation.

Once the autonegotiation operation is completed, the communications device 200 may then change the frequency of its local receive clock signal from a relatively low frequency to a relatively high frequency (304). More specifically, during the autonegotiation operation, the communications device 200 generates the first local receive clock signal as having a relatively low frequency; then, once the autonegotiation operation is complete, the communications device 200 generates the second local receive clock signal as having a relatively high frequency. Thereafter, the communications device 200 may begin receiving high-speed data signals from the TX device (305). For example, the AFE 210 may receive the high-speed data signals, and the equalizer 220 may process the received data signals to mitigate the effects of ISI (e.g., to up the data eye).

The communications device 200 may apply the second (e.g., high-speed) frequency offset value to the second local receive clock signal to frequency-align the second local receive clock signal with the second transmit clock signal, for example, to correctly sample the high-speed data signals (306). For example, the CRC 230 may adjust the frequency of RX_clk, based on the second frequency offset value, to enable the ADC 240 to sample the received data signals at the correct data rate. In this manner, the CRC 230 may match the frequency of the second local receive clock signal to the frequency of the second transmit clock signal in a single step (e.g., at the start of the high-speed data communication).

Finally, the communications device 200 may match the phase of the second local receive clock signal with the phase of the second transmit clock signal based on the received high-speed data signals (307). For some embodiments, the CRC 230 may adjust the phase of the second local receive clock signal using well-known clock recovery techniques (e.g., using a PLL). It is noted that because the respective frequencies of the second local receive clock signal and the second transmit clock signal are already synchronized, the CRC 230 may quickly match the phase of the second local receive clock signal to the phase of the second transmit clock signal (e.g., without having to scan the entire frequency range). Moreover, even if the actual frequency offset value is different than the calculated frequency offset value, the CRC 230 may further correct the frequency of the second local receive clock signal by making relatively minor frequency adjustments via the same well-known clock recovery techniques.

Thus, in accordance with some embodiments, during the relatively low-speed information exchange (e.g., autonegotiation operation), the receiving device may use clock recovery techniques to determine a first frequency offset value between the first local receive clock signal and the first transmit clock signal and to align the frequency of the first local receive clock signal with the frequency of the first transmit clock signal. The receiving device may then derive the second frequency offset value from the first frequency offset value (e.g., without using clock recovery techniques).

Then, during the relatively high-speed data communications, the receiving device generates the second local receive clock signal, and the transmitting device generates the second transmit clock signal. The second transmit clock signal, which may be used to transmit data from the transmitting device to the receiving device, has a greater frequency than the first transmit clock signal. The second local receive clock signal, which may be used to sample data received in the receiving device, has a greater frequency than the first local receive clock signal.

The receiving device may use the second frequency offset value to align the frequency of the second local receive clock signal with the frequency of the second transmit clock signal, and may then use clock recovery techniques to align the phase of the second local receive clock signal with the phase of the second transmit clock signal. In this manner, the receiving device uses clock recovery techniques, during the relatively high-speed data transmissions, only for phase aligning the local receive clock signal with the transmit clock signal, which in turn allows for faster clock synchronization operations (e.g., as compared to conventional devices that use clock recovery techniques, during the relatively high-speed data transmissions, to align both the phase and frequency of the receive clock signal with the transmit clock signal.

Figure 4:
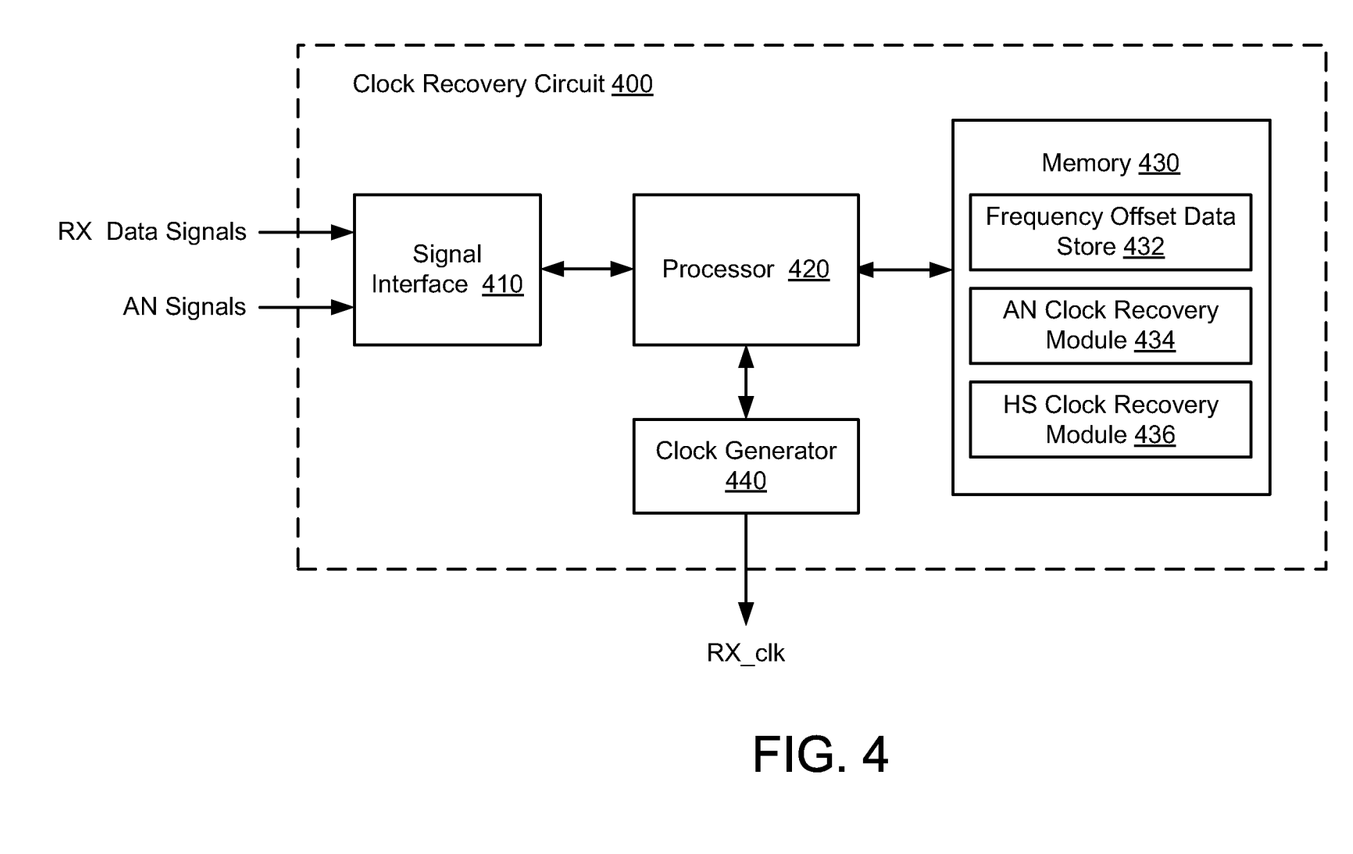
FIG. 4 shows a block diagram of a clock recovery device in accordance with some embodiments.

FIG. 4 shows a block diagram of a clock recovery circuit 400 in accordance with some embodiments. The clock recovery circuit 400 may be implemented, for example, as a clock recovery circuit within a communications circuit. The clock recovery circuit 400 includes a signal interface 410, a processor 420, a memory 430, and a clock generator 440. The signal interface 410 may be used to receive incoming signals transmitted by a TX device. For example, incoming signals may include low-speed autonegotiation signals and high-speed data signals. For some embodiments, the clock recovery circuit 400 may recover a clock signal (RX_clk) to be used in sampling the high-speed data signals based on the low-speed autonegotiation signals.

Memory 430 includes a frequency offset data store 432 for storing a frequency offset value to be applied to a local receive clock signal for purposes of sampling the high-speed data signals. Furthermore, the memory 430 may include a non-transitory computer-readable storage medium (e.g., one or more nonvolatile memory elements, such as EPROM, EEPROM, Flash memory, a hard drive, etc.) that may store the following software modules:

- an autonegotiation (AN) clock recovery module 434 to match the frequency of the local receive clock signal to the frequency of a corresponding transmit clock signal based on autonegotiation signals received from a TX device; and
- a high-speed (HS) clock recovery module 436 to match the phase of the local receive clock signal to the phase of the transmit clock signal based on high-speed data signals received from the TX device; and Each software module may include instructions that, when executed by the processor 420, may cause the clock recovery circuit 400 to perform the corresponding function. Thus, the non-transitory computer-readable storage medium of memory 430 may include instructions for performing all or a portion of the operations described above with respect to FIG. 3.

The processor 420, which is coupled between the signal interface 410 and the memory 430, may be any suitable processor capable of executing scripts of instructions of one or more software programs stored in the clock recovery circuit 400 (e.g., within memory 430). For example, the processor 420 may execute the AN clock recovery module 434 and/or the HS clock recovery module 436.

The AN clock recovery module 434 may be executed by the processor 420 to match the frequency of the local receive clock signal to the frequency of a corresponding transmit clock signal based on autonegotiation signals received from a TX device. As described above, with reference to FIG. 2A, the autonegotiation signals may specify communications parameters (e.g., communication speed, duplex mode, flow control, etc.) that the TX device is able to support. These autonegotiation signals are typically transmitted at relatively low speeds prior to establishing a high-speed data communication with the TX device. For some embodiments, the processor 420, in executing the AN clock recovery module 434, may match the frequency of the local receive clock to that of the transmit clock using well-known clock recovery techniques. For example, the processor 420 may generate control signals that cause the clock generator 440 to adjust the frequency of the local receive clock signal.

For some embodiments, the clock generator 440 may include a charge pump and a voltage-controlled oscillator (VCO). For example, the charge pump may supply a voltage to the VCO based on the control signals received from the processor 420. Furthermore, the VCO may output the local receive clock (RX_clk) in response to the voltage supplied by the charge pump. More specifically, the frequency and/or phase of the local receive clock signal may be adjusted by varying the control voltage output from the charge pump. Because autonegotiation signals are received at relatively low speeds, the AN recovery module 434, as executed by the processor 420, may quickly match the frequency of the local receive clock signal to that of the transmit clock signal (e.g., without having to scan the entire available frequency range).

For some embodiments, the AN recovery module 434, as executed by the processor 420, may further determine a frequency offset value to be applied to the local receive clock signal during subsequent high-speed data communications. For example, the processor 420 may first determine an initial low-speed frequency offset value between the local receive clock signal and the transmit clock signal based on the autonegotiation signals. The processor 420 may then calculate the high-speed frequency offset value as a scalar multiple (or fraction) of the low-speed frequency offset value. For some embodiments, the high-speed frequency offset value may be stored in the frequency offset data store 432, and thereafter used for subsequent high-speed data communications.

The HS clock recovery module 436 may be executed by the processor 420 to match the phase of the local receive clock signal to the phase of the transmit clock signal based on high-speed data signals received from the TX device. For example, the clock recovery circuit 400 may begin receiving high-speed data signals from the TX device upon completion of the autonegotiation operation. The HS clock recovery module 436, as executed by the processor 420, may first apply the high-speed frequency offset value to the local clock signal, for example, by outputting control signals that denotes the frequency offset value to the clock generator 440.

The processor 420, in executing the HS clock recovery module 436, may then match the phase of the local receive clock signal with the phase of the transmit clock signal, for example, by adjusting the phase of the local receive clock signal using well-known clock recovery techniques. It is noted that because the respective frequencies of the transmit clock signal and the receive clock signal are already synchronized, the HS clock recovery module 436, as executed by the processor 420, may quickly match the phase of the local receive clock signal to the phase of the transmit clock signal (e.g., without first having to scan the entire frequency range). Moreover, even if the actual frequency offset value is different the calculated frequency offset value, the processor 420, in executing the HS clock recovery module 436, may further correct the frequency of the local receive clock signals by making only minor adjustments to the frequency offset value supplied to the clock generator 440.

Figure 5:
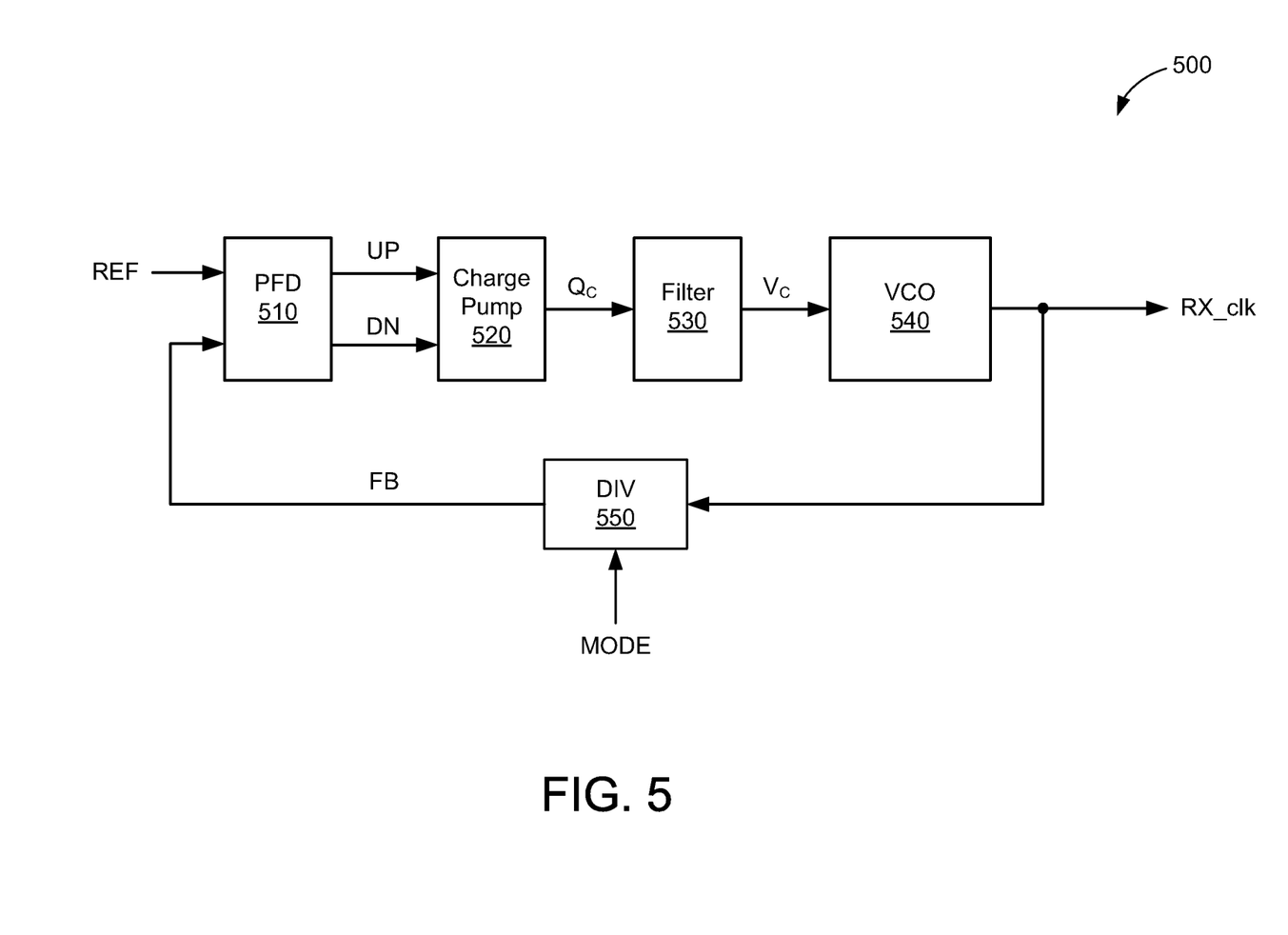
FIG. 5 shows a block diagram of a phase-locked loop (PLL) circuit that may operate as a clock generator circuit in accordance with some embodiments.

FIG. 5 shows a block diagram of a phase-locked loop (PLL) circuit 500 that may be one embodiment of the clock generator 440 of FIG. 4 (e.g., configured as a fractional-N frequency synthesizer). PLL circuit 500 includes a phase and frequency detector (PFD) 510, a charge pump 520, a loop filter 530, a voltage-controlled oscillator (VCO) 540, and a frequency divider 550 (which may also include a suitable sigma-delta modulator, not shown for simplicity). The PFD 510 compares the relative timing (e.g., phase difference) between the edges of a reference signal (REF) and a feedback (FB) signal to generate UP and DN control signals. Charge pump 520 converts the UP and DN control signals to a charge ($Q_C$) that is proportional to the phase difference between signals REF and FB. The charge generated by the charge pump 520 is filtered (e.g., integrated) by filter 530 and provided as a control voltage $V_C$ to the VCO 540. The VCO 540 generates the local receive clock signal (RX_clk) as the PLL output signal (e.g., in response to the control voltage $V_C$). The signal RX_clk is divided by frequency divider 550 to generate the FB signal.

The value of the divisor provided by frequency divider 550 may be selected (or otherwise controlled) by a mode signal (MODE). For example, during the relatively low-speed information exchanges described above, the MODE signal may be driven to a first state that causes the PLL circuit to provide a relatively low frequency for the RX_clk signal (e.g., to generate the first local receive clock signal). Then, during the subsequent, relatively high-speed data transmissions described above, the MODE signal may be driven to a second state that causes the PLL circuit to provide a relatively high frequency for the RX_clk signal (e.g., to generate the second local receive clock signal). In this manner, a single PLL circuit 500, acting as the clock generator circuit 440 of FIG. 4, may be used to generate both the first local receive clock signal (for the relatively low-speed information exchanges) and the second local receive clock signal (for the relatively high-speed data transmissions).

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense. For example, the method steps depicted in the flow chart of FIG. 3 may be performed in other suitable orders, multiple steps may be combined into a single step, and/or some steps may be omitted. In another example, while modules in FIG. 4 are depicted as software in memory 430, any of the modules may be implemented in hardware, software, firmware, or a combination of the foregoing.

What is claimed is:

1. A method of performing a clock recovery operation in a receiving device, comprising:
   during a relatively low-speed information exchange between the receiving device and a transmitting device:
      generating a first receive clock signal in the receiving device;
      receiving autonegotiation signals from the transmitting device;
      matching a frequency of the first receive clock signal with a frequency of a first transmit clock signal used by the transmitting device based, at least in part, on the autonegotiation signals; and
      determining a first frequency offset value between the first receive clock signal and the first transmit clock signal; and
   during a subsequent, relatively high-speed data transmission between the receiving device and the transmitting device:
      generating a second receive clock signal in the receiving device, wherein the first receive clock signal has a relatively low frequency and the second receive clock signal has a relatively high frequency;
      generating a second frequency offset value based on the first frequency offset value and a factor;
      matching a frequency of the second receive clock signal with a frequency of a second transmit clock signal, used by the transmitting device during the relatively high-speed data transmission, by applying the second frequency offset value to the second receive clock signal;
      receiving data from the transmitting device; and
      matching a phase of the second receive clock signal with a phase of the second transmit clock signal based, at least in part, on the received data.

2. The method of claim 1, wherein the factor denotes a relationship between the relatively low frequency and the relatively high frequency.

3. The method of claim 1, wherein the relatively low-speed information exchange comprises an autonegotiation operation during which:
   the receiving device declares its communication capabilities to the transmitting device; and
   the receiving device receives the transmitting device's communication capabilities from the transmitting device.

4. The method of claim 1, wherein the autonegotiation signals include a plurality of link pulses.

5. The method of claim 4, wherein matching the frequency of the first receive clock signal with the frequency of the first transmit clock signal comprises:
   determining a phase offset value between the first receive clock signal and the plurality of link pulses; and
   adjusting the frequency of the first receive clock signal based on the phase offset value.

6. The method of claim 1, wherein the receiving device receives signals from the transmitting device using 10 GBASE-KR Ethernet protocols.

7. The method of claim 1, wherein the relatively low-speed information exchange is performed at 312.5 Mbps, and wherein the relatively high-speed data transmission is performed at 10.3125 Gbps.

8. The method of claim 7, wherein determining the second frequency offset value comprises:

$$Rx\_10.3125G - Tx\_10.3125G = (Rx\_312.5M - Tx\_312.5M) \times 33.$$

9. A communication device, comprising:
   receiver circuitry configured to:
      receive autonegotiation signals from a transmitting device during a relatively low-speed information exchange; and
      receive data from the transmitting device during a relatively high-speed data transmission; and
   a clock recovery circuit configured to:
      during the relatively low-speed information exchange:
         generate a first receive clock signal;
         match a frequency of the first receive clock signal with a frequency of a first transmit clock signal, used by the transmitting device to transmit the autonegotiation signals, based, at least in part, on the autonegotiation signals; and
         determine a first frequency offset value between the first receive clock signal and the first transmit clock signal; and
      during the relatively high-speed data transmission:
         generate a second receive clock signal, wherein the first receive clock signal has a relatively low frequency and the second receive clock signal has a relatively high frequency;
         generate a second frequency offset value based on the first frequency offset value and a factor;
         match a frequency of the second receive clock signal with a frequency of a second transmit clock signal, used by the transmitting device to transmit the data during the relatively high-speed data transmission, by applying the second frequency offset value to the second receive clock signal; and
         match a phase of the second receive clock signal with a phase of the second transmit clock signal based, at least in part, on the received data.

10. The communication device of claim 9, wherein the factor denotes a relationship between the relatively low frequency and the relatively high frequency.

11. The communication device of claim 9, wherein the relatively low-speed information exchange comprises an autonegotiation operation during which:
   the communication device declares its communication capabilities to the transmitting device; and
   the communication device receives the transmitting device's communication capabilities from the transmitting device.

12. The communication device of claim 9, wherein the autonegotiation signals include a plurality of link pulses.

13. The communication device of claim 12, wherein the clock recovery circuit is to match the frequency of the first receive clock signal with the frequency of the first transmit clock signal by:
   determining a phase offset value between the first receive clock signal and the plurality of link pulses; and
   adjusting the frequency of the first receive clock signal based on the phase offset value.

14. The communication device of claim 9, wherein the communications device receives signals from the transmitting device using 10 GBASE-KR Ethernet protocols.

15. The communication device of claim 9, further comprising:
an equalizer, coupled between the receiver circuitry and the clock recovery circuit, to mitigate intersymbol interference in signals received by the communication device, and wherein the receiver circuitry is to selectively output the received autonegotiation signals and data to the equalizer or to the clock recovery circuit based on a communication mode of the communication device.

16. The communication device of claim 15, wherein the receiver circuitry is to output the received autonegotiation signals to the clock recovery circuit during the relatively low-speed information exchange, and wherein the receiver circuitry is to output the received data to the equalizer during the relatively high-speed data transmission.

17. A non-transitory computer-readable storage medium containing program instructions that, when executed by a processor provided within a communication device, causes the communication device to:
during a relatively low-speed information exchange with a transmitting device:
generate a first receive clock signal;
receive autonegotiation signals from the transmitting device;
match a frequency of the first receive clock signal with a frequency of a first transmit clock signal used by the transmitting device based, at least in part, on the autonegotiation signals; and
determine a first frequency offset value between the first receive clock signal and the first transmit clock signal; and
during a subsequent, relatively high-speed data transmission with the transmitting device:
generate a second receive clock signal, wherein the first receive clock signal has a relatively low frequency and the second receive clock signal has a relatively high frequency;
generate a second frequency offset value based on the first frequency offset value and a factor;
match a frequency of the second receive clock signal with a frequency of a second transmit clock signal, used by the transmitting device during the relatively high-speed data transmission, by applying the second frequency offset value to the second receive clock signal;
receive data from the transmitting device; and
match a phase of the second receive clock signal with a phase of the second transmit clock signal based, at least in part, on the received data.

18. The non-transitory computer-readable storage medium of claim 17, wherein the factor denotes a relationship between the relatively low frequency and the relatively high frequency.

19. The non-transitory computer-readable storage medium of claim 17, wherein the relatively low-speed information exchange comprises an autonegotiation operation during which:
the communication device declares its communication capabilities to the transmitting device; and
the communication device receives the transmitting device's communication capabilities from the transmitting device.

20. The non-transitory computer-readable storage medium of claim 17, wherein the autonegotiation signals include a plurality of link pulses.

21. The non-transitory computer-readable storage medium of claim 20, wherein execution of the program instructions to match the frequency of the first receive clock signal with the frequency of the first transmit clock signal causes the communication device to:
determine a phase offset value between the first receive clock signal and the plurality of link pulses; and
adjust the frequency of the first receive clock signal based on the phase offset value.

22. The non-transitory computer-readable storage medium of claim 17, wherein the communication device receives signals from the transmitting device using 10 GBASE-KR Ethernet protocols.

23. The non-transitory computer-readable storage medium of claim 17, wherein the relatively low-speed information exchange is performed at 312.5 Mbps, and wherein the relatively high-speed data transmission is performed at 10.3125 Gbps.

24. A method of clock recovery in a first device, comprising:
generating a receive clock signal in the first device;
receiving autonegotiation signals from a second device during a relatively low-speed information exchange;
adjusting a frequency of the receive clock signal, based on the autonegotiation signals, to align the receive clock signal with a transmit clock signal of the second device during the relatively low-speed information exchange;
determining a data rate associated with high-speed data transmissions by the second device;
determining a frequency offset value based at least in part on the data rate associated with the high-speed data transmissions and a data rate of the autonegotiation signals;
receiving data signals from the second device during a relatively high-speed data transmission; and
adjusting the frequency of the receive clock signal, using the frequency offset value, to align the receive clock signal with the transmit clock signal of the second device during the relatively high-speed data transmission.

25. The method of claim 24, wherein the relatively low-speed information exchange corresponds to an autonegotiation operation for determining one or more communication capabilities of the second device.

26. The method of claim 24, further comprising:
determining the data rate of the data signals based on information provided in the autonegotiation signals.

27. The method of claim 24, wherein the frequency offset value is based at least in part on a ratio of the data rate of the data signals relative to the data rate of the autonegotiation signals.

28. The method of claim 27, wherein the determining comprises:
determining an initial frequency offset between the receive clock signal and the transmit clock signal based on the autonegotiation signals received during the relatively low-speed information exchange; and
calculating the frequency offset value by applying the ratio to the initial frequency offset.

29. The method of claim 24 further comprising:
aligning a phase of the receive clock signal with a corresponding phase of the transmit clock signal based at least in part on the received data signals.

30. The method of claim 24, wherein the receive clock signal is used to sample the data signals transmitted by the second device.

* * * * *